United States Patent [19]
Revilla et al.

[11] Patent Number: 5,553,236
[45] Date of Patent: Sep. 3, 1996

[54] METHOD AND APPARATUS FOR TESTING A CLOCK STOPPING/STARTING FUNCTION OF A LOW POWER MODE IN A DATA PROCESSOR

[75] Inventors: Juan G. Revilla; Alfred L. Crouch, both of Austin, Tex.

[73] Assignee: Motorola, Inc., Schaumburg, Ill.

[21] Appl. No.: 399,113

[22] Filed: Mar. 3, 1995

[51] Int. Cl.⁶ .................................................. G06F 11/34
[52] U.S. Cl. ........................................ 395/183.01; 395/750
[58] Field of Search ............................ 395/183.01, 183.1, 395/183.22, 750; 371/3, 61, 62; 364/273.1

[56] References Cited

U.S. PATENT DOCUMENTS

| | | | |
|---|---|---|---|
| 4,698,748 | 10/1987 | Juzswik et al. | 364/200 |
| 4,716,354 | 12/1987 | Hacker | 320/29 |
| 4,839,642 | 6/1989 | Batz et al. | 340/825.52 |
| 5,283,792 | 2/1994 | Davies, Jr. et al. | 371/66 |
| 5,381,420 | 1/1995 | Henry | 371/22.3 |
| 5,396,498 | 3/1995 | Lestrout et al. | 371/3 |
| 5,428,790 | 6/1995 | Harper et al. | 395/750 |
| 5,446,904 | 8/1995 | Belt et al. | 395/750 |

*Primary Examiner*—Robert W. Beausoliel, Jr.
*Assistant Examiner*—Albert Decady
*Attorney, Agent, or Firm*—Keith E. Witek

[57] ABSTRACT

A processor (10) has an internal clock circuit (12), a CPU (14), and a test controller (16). The CPU (14) has a low-power mode of operation and a normal mode of operation. When in low power mode, the internal clock circuit isolates the CPU clock (18) from the internal clock (28) and pulls the internal clock (28) to a stable logic state to ensure that the CPU is not changing state and consuming power. The test controller (16) can be in a low power mode along with the CPU (14) or in a normal mode while the CPU (14) is in the low power mode via the test control signal (26). When the CPU is in low power mode and the controller (16) is in normal mode, the controller (16) tests the operation of the circuit (12) to logically ensure that handling of the clock (18) is proper when entering, maintaining and exiting the low power mode of operation.

45 Claims, 4 Drawing Sheets

METHOD AND APPARATUS FOR TESTING A CLOCK STOPPING/STARTING FUNCTION OF A LOW POWER MODE IN A DATA PROCESSOR

FIELD OF THE INVENTION

The present invention relates generally to data processing systems, and more particularly, to testing low power mode clock stopping and starting capability in a data processor.

BACKGROUND OF THE INVENTION

In many modern systems containing integrated circuits (ICs), low power is critical. In order to obtain low power within a product, transistor switching must be reduced to a minimum. In order to reduce transistor switching to a minimum, a clock signal or multiple clock signals are isolated from the internal circuitry of integrated circuits to prevent transistors with the integrated circuits from changing logical state. In addition, external terminals or pins or the IC may be tri-stated or isolated to further reduce power by minimizing current drain due to voltage mismatch. A main problem with using this technique of stopping a clock and isolating external terminals is that verification and testing of this low power mode is nearly impossible. How does one test an integrated circuit to determine that a low power mode was entered, maintained and exited properly if, when in this mode, all terminals are isolated and a clock is not functional. With no clock and no terminals to access the part, no test data can be input to and read from the part to logically verify low power mode operation.

To remedy this problem, many ICs are tested using an expensive analog current measurement technique. When in low power mode, a part is to draw a low level of power (assume 30 microamperes for sake of example). A current measurement resulting in a reading of 100 microamperes drawn or even 30.00001 microamps may indicate a problem with the low power mode operation. Even thought this technique recognizes a problem, it has no way of aiding a designer or tester in determining where in the IC the problem lies. Therefore, the designer or testers must wade through millions of transistors to find the few or many transistors that are causing the low power problems after the current measurements find there is a problem. Due to the need for finding small increments in current, an expensive current measurement device is needed. This approach is therefore not overly useful.

In other cases, ICs have been built with on-chip test controllers that are never capable of entering into low power mode. Because the test controller never enters low power mode, the test controller can be used to test the rest of the IC when in a low power mode of operation. Unfortunately, a portion of an IC that is incapable of entering a low power mode of operation significantly reduces the part's ability to obtain a lowest possible low power mode of operation. Without a lowest-possible mode of low power, test controller current draw will result in hours or days of lost battery time in portable systems that require a minimum current draw for ICs. Therefore, a need exists for a way to test an IC, especially internal low power clock handling of a low power mode of operation within an IC during low power mode. In addition, a method is needed to verify that a low power mode can be properly entered and exited, and that low power mode circuitry does not interfere with normal mode operation.

DESCRIPTION OF A PREFERRED EMBODIMENT

Generally, the present invention is a method and apparatus for testing an internal clock circuit of a data processor. The data processor is capable of operating in a normal mode of operation and a low power mode of operation. When the processor is in a normal mode of operation, the processor will consume an amount of power above a minimal rating and is fully functional. When the processor is in a low power mode of operation, the processor is consuming much less power than the normal mode of operation, but has been significantly reduced in operable functionality. This bipolar mode of operation allows a processor to save power over time by entering the low power mode when not in use and being in the normal mode of operation only during periods of high usage.

In order to attain a low power mode of operation, at least one clock signal internal to the microprocessor (or integrated circuit) is disabled or isolated via circuitry internal to the microprocessor to reduce power associated with combinational and sequential switching. In addition, input, output, and I/O pins external to the microprocessor are usually isolated to minimize DC current drain due to voltage mismatches. When a processor is isolated in low power mode via disconnected external terminals and isolated internal clock signals, testing of the low power mode status internal to the data processor is virtually impossible. The vectors cannot be applied and analyzed to a part that has no clock and no operable inputs and outputs. Applicants provide herein a test controller and a method which can be used to verify proper low power clock handling internal to a data processor, while the data processor is in a low power mode of operation. Therefore, elements of entering, maintaining, and exiting a low power mode of operation, which were previously untestable, are now testable to insure a higher quality part to customers and to allow rapid and efficient determination of errors when entering, maintaining, and exiting a low power mode.

Figure 1:
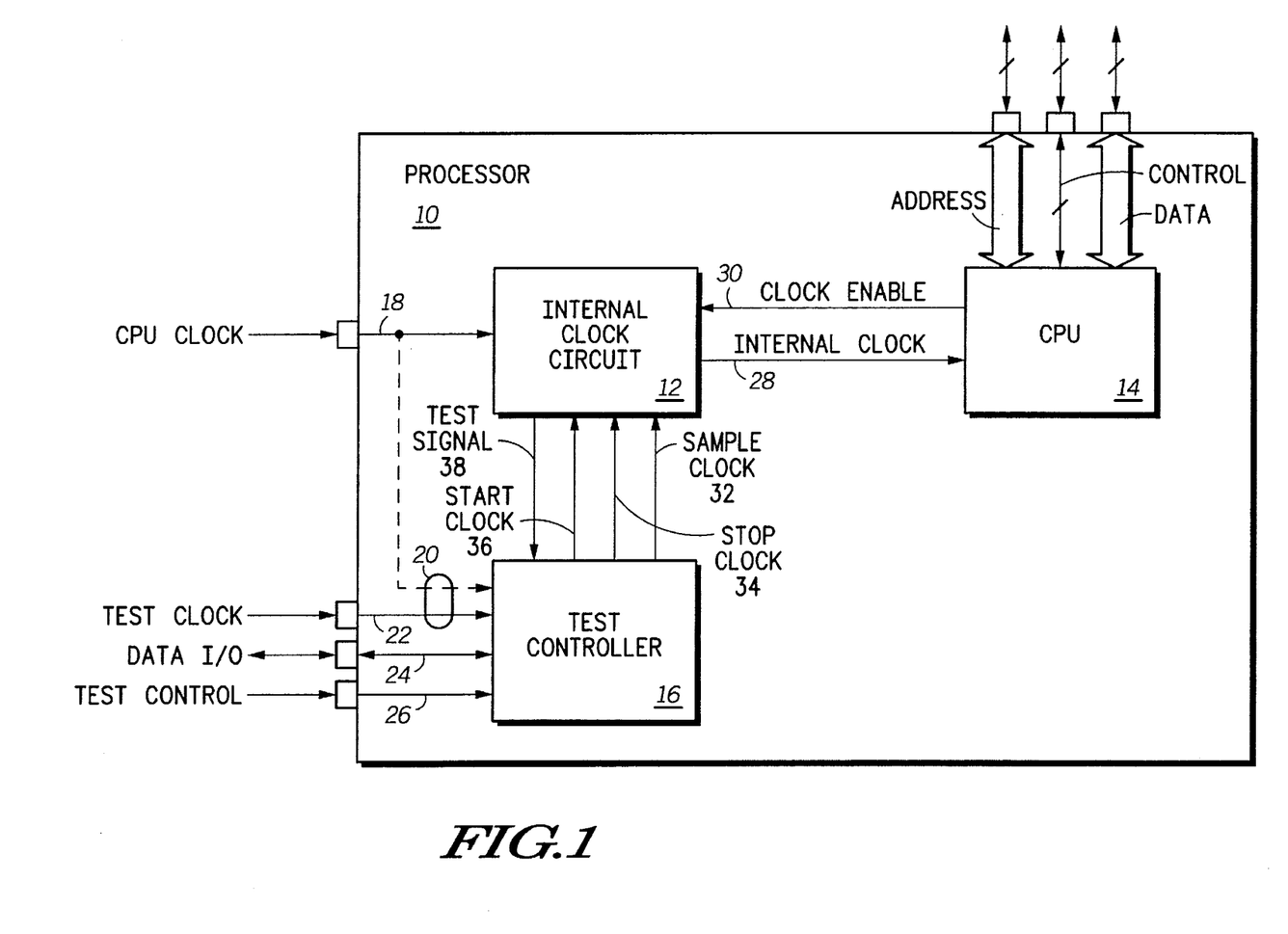
FIG. 1 illustrates, in a block diagram, a data processing system in accordance with the present invention.

FIG. 1 illustrates a data processor 10. Data processor 10 has a CPU 14. CPU 14 is connected by one or more buses to the external environment via external terminals or pins of the processor 10. In FIG. 1, these buses are labeled as an address bus, a control bus, and a data bus. The CPU 14 is capable of operating in at least two modes of operation. One mode of operation is a normal mode of operation, which generally draws significant amount of power and allows the CPU to be fully functional. Another mode of operation is a low power mode of operation, wherein the CPU is not significantly changing states (due to lack of a clock signal) and is isolated from an external environment. In other embodiments, it is possible for CPU 14 to have more than two modes of operation. In order to determine which mode the data processor is operating in, the CPU provides a clock enable signal 30 as an output. When the clock enable signal 30 is in a first state, the internal clock circuit couples a CPU clock 18 from an external terminal of processor 10 to an internal clock line 28 so that the CPU 14 is fully functional in a normal mode of operation. When the CPU 14 enters a low power mode of operation, a second state is sent via clock enable 30 so that the internal clock circuit 12 can properly isolate CPU clock 18 from the internal clock 28, thereby reducing power in CPU 14.

In many cases, when entering, maintaining, or exiting a low power mode of operation, either the internal clock circuit 12 or the CPU 14 will not operate properly. If a malfunction occurs while in low power mode, the internal clock circuit in processor 10 cannot be properly tested since the clock to the CPU 14 is stopped and many or all external terminals are isolated from use.

To remedy this situation, Applicants provide a test controller 16 in FIG. 1. Test controller 16 is illustrated in FIG. 1 as being coupled to internal clock circuit 12, but may also be coupled to the CPU 14 to conduct further low power diagnostic tests. The test controller 16 is coupled to the internal clock circuit 12 via outputs labeled sample clock 36, stop clock 34, and sample clock 32. Signals 32, 34, and 36 are used as test control signals to manipulate internal clock circuit 12 in order to receive test information/data from the circuit 12 via a test signal 38. The test controller 16, in response to the signals 32 through 38, is able to communicate with external circuitry or determine internal to the test controller 16 whether or not the internal clock circuit 12 and/or the CPU 14 is operating properly when handling low power mode entrance, maintenance, and exit.

The test controller 16 is coupled to a plurality of external terminals in order to allow it to send and receive external stimulus. Test controller 16 is operably coupled to one clock selected from a group consisting of the CPU clock 18 and test clock 22. Therefore, element 20 in FIG. 1 is used to indicate that either CPU clock 18 or test clock 22 is connected to test controller 16. In many modern microprocessors, multiple external and/or internal clock signals are utilized and multiple clocks can be provided for use herein. These multiple clocks can be stopped and started individually or collectively by the circuitry taught herein. Test controller 16 communicates with external circuitry via data I/O bus 24. The data I/O bus 24 may contain one or more of input/output pins, input pins, and/or output pins.

Test controller 16 is coupled to a test control signal 26. When the processor 10 is placed into a low power mode of operation, all external pins are isolated from the external world with the exception of test control pin 26. Test control pin 26 remains active when the processor 10 enters into a low power mode of operation. Therefore, a logic signal provided via the test control line 26 can be used to bring the test controller 16 into a normal mode of operation while the CPU 14 and internal clock circuit 12 are operating in a low power mode of operation. When the test control signal 26 wakes the test controller 16 from a low power mode and places the controller 16 into a normal mode of operation, the signals 22, 24, and 26 to the test controller 16 all become active and are no longer isolated. Therefore, the test controller 16 can be made selectively fully functional via a signal provided by test control 26 while the internal clock circuit 12 and the CPU 14 are in a low power mode. When the controller 16 is in a normal mode and the rest of processor 10 is in a low power mode, the test controller can test the internal clock circuit 12 and/or CPU 14 when in the low power mode of operation. Also, test control 26 may be used to place the controller 16 from a normal mode to a low power mode along with the rest of processor 10 to achieve a minimal amount of power for the entire processor 10.

Figure 2:
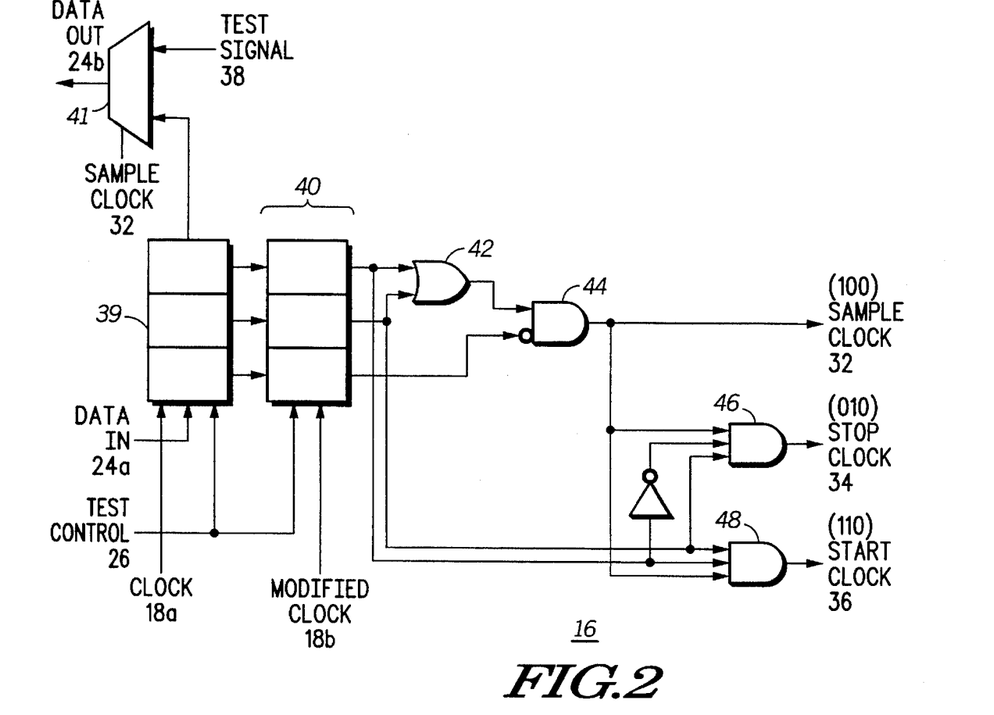
FIG. 2 illustrates, in a block diagram, a first embodiment of the test controller of FIG. 1.

FIG. 2 illustrates one embodiment of the test controller 16. Test controller 16 has a serial shift register 39. This embodiment has registers 39 and 40 that are clocked as a function of the clock signal 18a which is provided by the buffers 62 and remains active when in low power mode of operation even though a remaining clock distribution network or H tree is isolated/disabled. Register 39 is parallel coupled to a parallel load register 40. Register 39 receives serial input data from an external terminal labeled data in 24a. Register 39 is clocked via the clock 18a. Therefore, as serial data is provided via data in 24a, the clock 18a shifts this information serially into register 39. In some cases, data stored within the register 39 needs to be viewed external to the data processor 10. Therefore, a data out path 24b can provide information from the register 39 via a path through a multiplexer 41. The data out signal 24b accepts output data from either the register 39, or the test signal 38. The multiplexer 41 is selected via the sample clock signal 32. When the internal clock circuit 14 is being sampled in response to sample clock signal 32, information is provided on test signal 38 and routed through the multiplexer 41 to an output pin coupled to data out 24b.

Once serial data is completely shifted and settled into register 39, a modified clock 18b which operates at a frequency lower than the clock 18 is used to parallel load the contents of register 39 into register 40. Usually, if clock 18a operates at a frequency f, modified clock 18b will operate at a frequency f/n where n is a positive integer, or may be controlled by control logic to selectively pulse at unequal intervals as needed by the test controller. Therefore, register 40 is stable and provides stable control signals 32 through 36 while new information can be shifted into register 39 for use at a future time.

Once a value is parallel loaded into register 40, gates 42 through 48 function as a decoder to provide the control signals 32 through 36 as illustrated in FIG. 2. It should be understood that any set or combination of inputs to register 40 can be used to provide the control signals 32 through 36. Specifically, in FIG. 2, a binary value of 100 in register 40 asserts sample clock 32, a binary value of 010 asserts stop clock 34, and a binary value of 110 in register 40 asserts a start clock signal 36. Test control 26 is used to place the test controller 16 in either a normal mode of operation or a low power mode of operation. In normal mode of operation, the registers 39 and 40 are capable of receiving data and the signals 32 through 36 are capable of being asserted. When in low power mode of operation, the test control signal resets the registers 39 and 40 so that the stable value (usually all zeros or all ones) is provided to the gates 42, 44, 46, and 48. In this low power state, no logical switching occurs in test controller 16 and the control signals 32 through 26 are inoperable. In this low power mode, the data processor is operating at a minimal power consumption. Test control signal 26 can selectively place the test controller into a normal mode of operation while the CPU and internal clock circuit are in a low power mode of operation.

This embodiment remains continually active during low power mode and therefore consumes a small amount of power.

Figure 3:
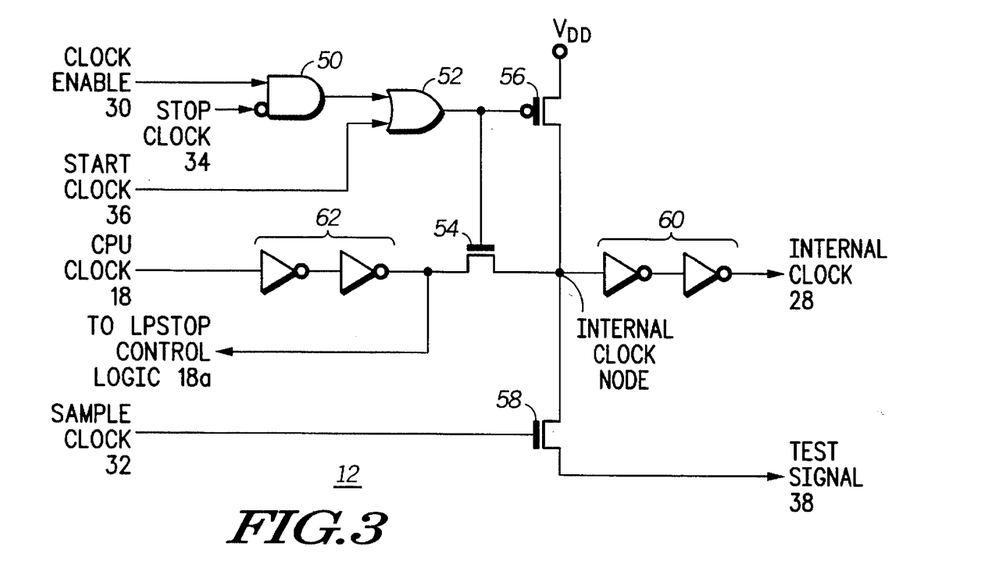
FIG. 3 illustrates, in a block diagram, a first embodiment of the internal clock circuit of FIG. 1.

FIG. 3 illustrates a first embodiment of the internal clock circuit 12 of FIG. 1. FIG. 3 is a circuit that receives control signals from a circuit driven by a synchronous clock as illustrated in FIG. 2. Therefore, no clock alignment circuitry is needed in the circuit of FIG. 3 as is needed in FIG. 5 (see later discussion). FIG. 3 illustrates that the CPU clock input 18 is coupled to a series of buffers 62. Buffers or dual-serial inverters are used to provide sharpening of clock edges and/or time delay. An isolation transistor 54 is coupled in series between the buffer 62 and a plurality of buffers 60. An internal clock signal 28 is provided via the buffers 60. The circuit node located between transistor 54 and the buffer 60 is referred to as an internal clock node of the circuit 12. The internal clock node is coupled through a pull-up transistor 56 to a power supply which can be either VDD or ground. In FIG. 3, VDD is coupled to the pull-up transistor 56. The gate electrodes of the transistors 54 and 56 are controlled via logic gates 52 and 50. The inputs of logic gates 50 and 52 comprise clock enable 30, stop clock 34, and start clock 36.

When stop clock 34 and start clock 36 are de-asserted, clock enable 30 has exclusive control over the transistors 54 and 56. Therefore, the CPU can selectively enable or disable transistors 54 and 56 via the clock enable 30. When clock enable 30 is a logic 1, the pull-up transistor 56 is off and the isolation transistor 54 is on. Therefore, when clock enable 30 is a logic 1, the CPU clock 18 is coupled to the internal clock 28 and the processor 10 is operating in a normal mode of operation since the clock is not isolated from the CPU 14. When clock enable 30 is a logic 0, the isolation transistor 54 is off and the pull-up transistor 56 is on. In this state, the CPU clock 18 is isolated from the internal clock 28 and the internal clock 28 is wired to VDD or ground to provide a stable constant voltage value, which is not oscillating. When in this mode with enable 30 at a logic 0, the CPU and internal clock circuit are operating in a low power mode of operation.

The test controller 16 utilizes stop clock 34 and start clock 36 to test the low power mode operation of the internal clock circuit 12 and the CPU 14. Stop clock 34 and start clock 36 override any signal provided via clock enable 30. Therefore, an asserted stop clock 34 will turn on transistor 56 and shut off transistor 54 to attempt to force the internal clock circuit 12 into a low power mode of operation. The start clock 36, when enabled, will force transistor 56 into an off state and force transistor 54 into an on state to simulate or force a normal mode of operation for test purposes. After subjecting the circuit to FIG. 3 to either a stop clock 34 or a start clock 36, the sample clock 32 is used sample the internal clock node via test signal 38 and provide signal 38 to the test controller 16. In order to provide the test signal 38, sample clock 32 turns on a pass transistor 58 so that the test signal 38 conducts a signal located on the internal clock node. Through the use of stop clock 34, start clock 36, and sample clock 32, the test controller 16 is able to test various conditions and operating modes of the circuit 12 to determine whether the CPU 14 and the internal clock circuit 12 are functioning properly.

Figure 4:
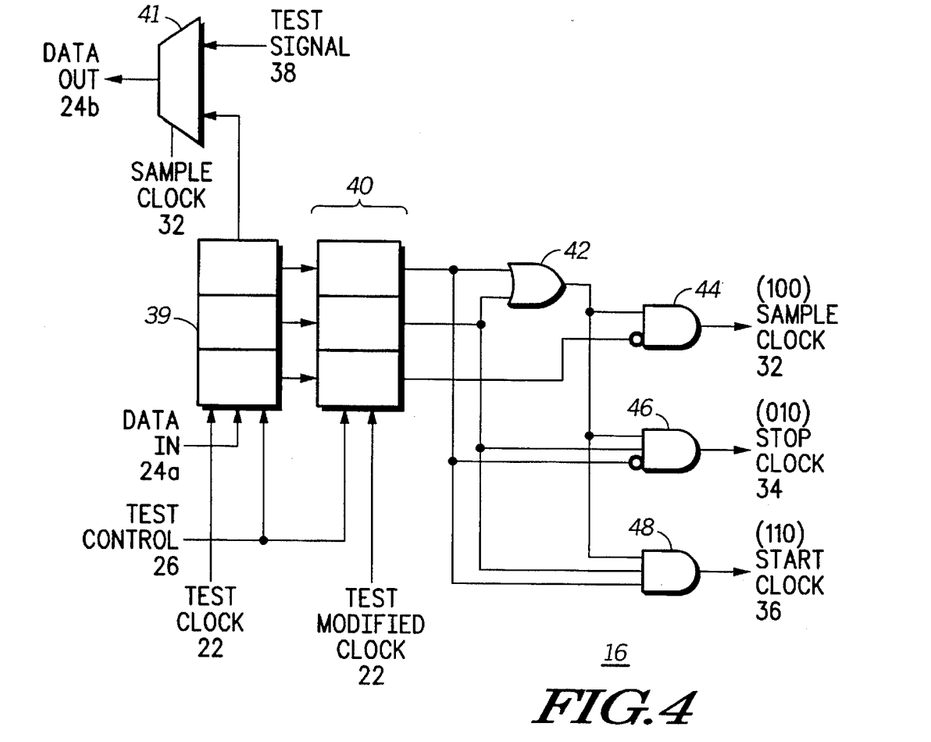
FIG. 4 illustrates, in a block diagram, a second embodiment of the test controller of FIG. 1.

FIG. 4 illustrates an alternative embodiment to FIG. 2. FIG. 4 is essentially identical to FIG. 2 with the exception that the test clock 22 from FIG. 1 is used to control the test controller 16 as opposed to the CPU clock 18 from FIG. 1. Other than the difference in clock type and/or clock frequency, the circuit of FIG. 4 is functionally equivalent to the circuit of FIG. 2. The registers 39 and 40 are typically compatible with the well-known JTAG standard for testing integrated circuits.

Figure 5:
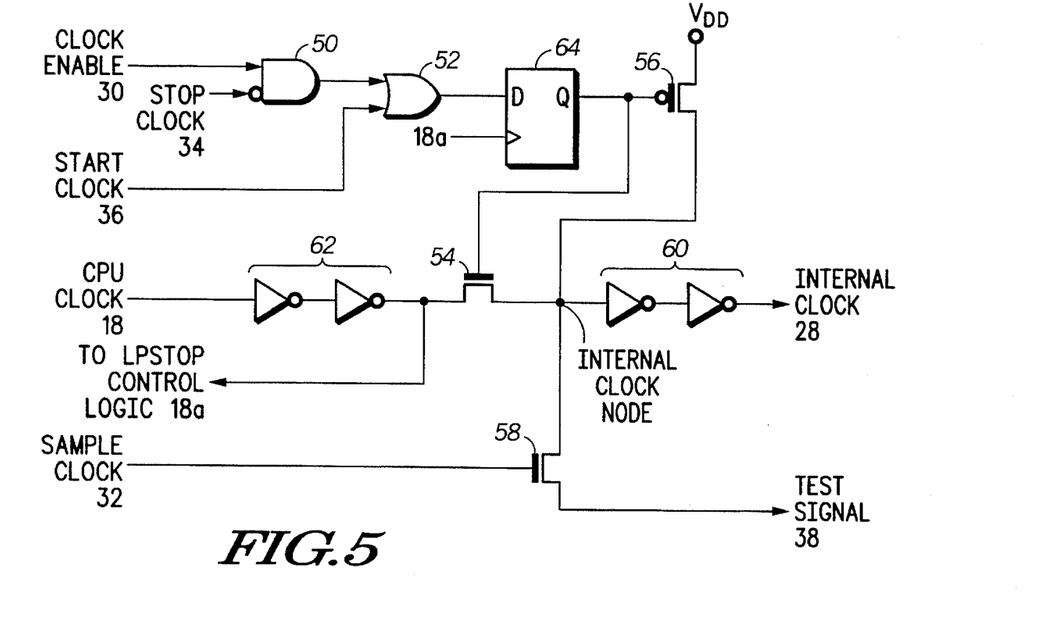
FIG. 5 illustrates, in a block diagram, a second embodiment of the internal clock circuit of FIG. 1.

FIG. 5 is an alternative circuit to the circuit illustrated in FIG. 3. The circuit of FIG. 5 contains elements analogous to elements in FIG. 3. These analogous elements are numbered with identical numerals. FIG. 5 differs from FIG. 3 via the incorporation of a D flip-flop storage element 64. This flip-flop storage element 64 is added because the register 39 and 40 are operated from a separate test clock 22 that may not be in-sync with the clock 18. This embodiment allows the test clock to be totally disabled or isolated to achieve an optimal low power mode where the circuit of FIG. 4 is not switching state as would the circuit of FIG. 2. Since the test controller of FIG. 4 operates off of a test clock 22, the flip-flop 64 is required in order to buffer or align signals provided via the test controller 16. In essence, the functionality of FIG. 5 is identical to the functionality of FIG. 3 with the exception of the storage ability of the flip-flop 64, which is coupled to the gates of transistors 54 and 56 so that non-sufficient duty cycles or pulses are transmitted.

Figure 6:
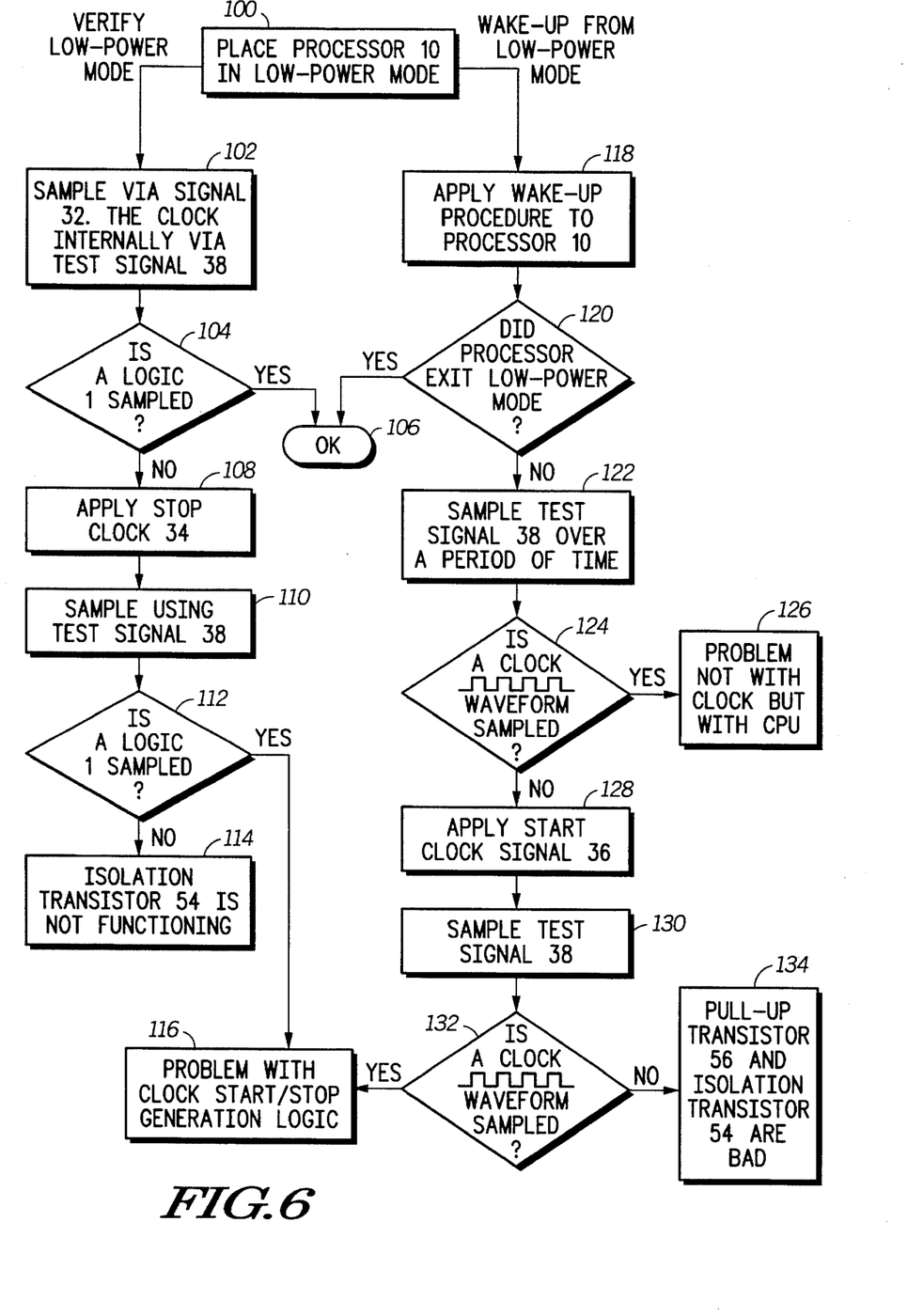
FIG. 6 illustrates, in a flowchart, a method for testing clock stopping and starting within a data processor with a low power mode of operation, the method being in accordance with the present invention.

FIG. 6 illustrates a method for testing a data processor when entering, maintaining, or exiting a low power mode of operation. In a step 100, the processor 10 is placed into a low power mode of operation. From step 100, two possible branches or alternatives to testing can be taken. One path is labeled as "verify low power mode" and the other path is labeled as "wake up from low power mode." A test can be designed to run one of the two branches independent of the other or, preferably, perform one branch and then serially perform the next test branch illustrated in FIG. 6. By performing both branches from step 100, a complete test procedure is executed.

After the processor is placed in low power mode via step 100, a step 102 is performed. In step 102, the sample clock signal 32 is asserted so that the internal clock node is sampled via test signal 38 through the transistor 58. When in low power mode, the internal clock node should be coupled to VDD (or ground) through transistor 56 and isolated from the CPU clock 18 via transistor 54. To ensure that this is the case, a step 104 is performed. If a stable and non-oscillating VDD value is sampled over time on the internal clock node in step 104, then the low power mode was properly entered and is properly being maintained by the processor 10 (a step 106 indicates proper operation). If a stable VDD logic 1 is not sampled in a step 104, then a step 108 is performed. In step 108, a stop clock 34 signal is applied to the circuit 12 via the test controller 16. The stop clock 34 is asserted to attempt to force the transistors 56 and 54 into a proper state where clock 18 is disconnected from clock 28 and the internal clock node is properly pulled-up to the voltage VDD.

After step 108, a step 110 is performed. In step 110, the sample clock 32 is asserted in order to once again read the internal clock node via the test signal 38. Once the test signal 38 is sampled in step 110, a step 112 is executed. In step 112, if a logic 1 is sampled in step 110, then a step 116 is performed, else a step 114 is performed. If a logic 1 is found in step 112, it is clear that the transistors 54 and 56 of FIG. 3 are properly operating, but the clock enable signal 30 was not properly generated or properly received by the circuit of FIG. 3. This condition is illustrated in FIG. 6 by step 116 wherein a problem is indicated with the clock start-stop generation logic of the CPU 14. Here, the CPU 14 may be optionally tested by the controller 16 to determine exactly where the CPU failed to execute the proper enable signal 30. If a logic 1 is not sampled in a step 112, step 114 is used to indicate that the transistors 56 and/or transistor 54 or not functioning properly. Therefore, steps 102 through 116 are used to ensure that the processor can properly enter a low power mode of operation and effectively isolate a clock 18 from the internal CPU 14.

After step 100 is performed a step 118 may be performed. In step 118, the CPU 14 is instructed to provide a proper clock enable signal 30 to attempt to bring the processor 10 out of a low power mode and into a normal mode of operation. In a step 120, if the processor properly exited low power mode and entered the normal mode of operation, then the processor is functioning properly and the test is terminated via a step 106. If in step 120, the low power mode was not exited, then a step 122 is performed. The inability to exit a low power mode can be determined by current measurement, sampling external terminals of the processor 10, attempting to execute instructions in the CPU 14, or checking to ensure that a clock has been properly provided on internal clock 28 to signify exiting of the low power mode of operation.

In a step 122, the internal clock node of FIG. 3 is sampled by asserting sample clock 32. The sampling in step 122 is a sample over time to attempt to determine if the internal clock node is oscillating in logic value (e.g. a clock signal) or stable at a logic 1 or logic 0. After sampling in step 122, a step 124 is performed. If a clock waveform is determined in step 124, then a step 126 is performed. Step 126 indicates that the circuitry of FIG. 3 is functioning properly, but that the CPU or like circuitry is not properly responding to the freshly connected clock and the CPU may optionally be tested to determine why the clock, properly provided by circuit 12, did not wake-up the CPU 14 to the normal mode. If a clock waveform is not discovered via a step 124, a step 128 is performed. In step 128, the start clock signal 36 is asserted. After asserting the start clock 36 in step 128, a step 130 is performed. In step 130, the internal clock node is sampled via the test signal 38. After sampling via step 130, a step 132 is performed. If an oscillating clock wave form is sampled in step 132, then a step 116 is performed. Step 116 indicates that the clock enable 30 was not properly generated or transmitted to the clock circuit of FIG. 3. If a clock wave form is not sampled in a step 132, then a step 134 is performed. The step 134 indicates that the pull-up transistor 156 and the isolation transistor 154 or FIG. 3 are not functioning properly. Therefore, the steps 100 through 134 of FIG. 6 are used to verify that the low power mode is properly entered and that the low power mode is properly exited by checking to ensure that the internal clock node is receiving the proper functional signals.

While the present invention has been illustrated and described with reference to specific embodiments, further modifications and improvements will occur to those skilled in the art. For example, a single clock or multi-clock processor can be used herein. The test signals output from the test controller can comprise greater or fewer signals than the three taught herein and can control selectively some or all of the plurality of possible clocks. Any interface between a test controller and external processor pins may be used herein and JTAG functionality and compatibility is possible for the processor 10. The registers of FIGS. 2 and 4 may be of any size other than three bits wide. The control signals, rather than being decoded internally, may be provided on dedicated start, stop, and sample external terminals. The test signal 38 may also be provided by a dedicated external terminal. By doing this, the dedicated external terminal for the signal 38 may be used to drive peripheral devices so that when the CPU 14 is in low power mode, other peripherals are automatically denied a clock signal.

Furthermore, the flow of FIG. 6 can be implemented in a state machine internal to the processor to perform the test of the clock(s) in a automated built-in-self-test (BIST) manner. This type of self test would create or provide the sample, stop, and start control signals in a known predetermined manner. Pull-up transistors, as used herein, may be replaced (or be synonymous with) with pull-down transistors and vice-versa. Isolation transistors may be isolation transmission gates having a P-channel transistor coupled in parallel to an N-channel transistor to avoid threshold voltage drops between clock 18 and clock 28. Plurality, as used herein, is any integer value between two and infinity and should not be limited to or interpreted as any other subrange or constant. The low power clock testing and apparatus taught herein may be used for devices other than CPUs such as memory ICs, analog circuitry, and the like.

In FIG. 2, the stop and start signals may be a function of the sample signal or independent from the sample signal. It is to be understood, therefore, that this invention is not limited to the particular forms illustrated and that it is intended in the appended claims to cover all modifications that do not depart from the spirit and scope of this invention.

What is claimed is:

1. A data processor formed on an integrated circuit substrate, the data processor comprising:

a central processing unit (CPU);

an internal clock circuit coupled to the CPU that provides a CPU clock signal to the CPU when in a normal mode of operation and selectively disconnects the CPU clock signal from the CPU to place the CPU in a low power mode, the CPU clock signal being provided via a CPU clock conductor;

a test controller formed on the integrated circuit substrate which is in the normal mode of operation when the CPU is in the low power mode of operation, the test controller being coupled to the internal clock circuit wherein the test controller provides at least one test signal to the internal clock circuit while the CPU is in the low power mode of operation;

wherein the internal clock circuit, when in the low power mode of operation, responds to the at least one test signal by providing data to the test controller which is used to indicate whether the CPU clock conductor is coupled to or isolated from the CPU; and wherein the internal clock circuit, when in the normal mode of operation, responds to the at least one test signal by providing data to the test controller to indicate whether the CPU clock conductor is coupled to or isolated from the CPU.

2. The data processor of claim 1 wherein a clock enable control signal is generated by the CPU and received by the internal clock circuit, the internal clock circuit preventing the CPU clock signal from being transmitted to the CPU when a first logic state is provided via the clock enable control signal.

3. The data processor of claim 1 wherein the CPU receives, instead of the CPU clock signal, a steady logic one value from the internal clock circuit when operating in the low power mode of operation.

4. The data processor of claim 1 wherein the CPU receives, instead of the CPU clock signal, a steady logic zero value from the internal clock circuit when operating in the low power mode of operation.

5. The data processor of claim 1 wherein an isolation transistor within the internal clock circuit has a first electrode for receiving the CPU clock signal and a second electrode for providing a signal to the CPU, the isolation transistor: (1) being turned-on when in a normal mode of operation so that the CPU clock signal is propagated to the CPU; and (2) being turned-off when in the low power mode of operation so that the CPU clock conductor is tri-stated from the CPU.

6. The data processor of claim 1 wherein the test controller operates in response to a clock signal, the clock signal being a signal selected from a group consisting of: the CPU clock signal and a test control clock signal separate from the CPU clock signal.

7. The data processor of claim 1 wherein the test controller samples an electrical value resident at a circuit node within the internal clock circuit to provide test data from the internal clock circuit to the test controller to determine if the low power mode is operating properly.

8. The data processor of claim 7 wherein the test data is transmitted external to the data processor via an external data terminal coupled to the test controller.

9. The data processor of claim 1 wherein the low power mode is entered in response to a computer low power mode instruction executed by the CPU.

10. The data processor of claim 1 wherein the test controller ensures that the CPU clock signal is properly isolated from the CPU when the CPU is in the low power mode by applying a stop clock control signal, which is a part of the at least one test signal, to the internal clock circuitry and sampling an electrical value on a circuit node in the internal clock circuitry via a sample clock control signal, which is a part of the at least one test signal, to determine whether the CPU clock signal is being properly isolated.

11. The data processor of claim 1 wherein the test controller ensures that the CPU clock signal is properly provided to the CPU when the CPU is not in the low power mode by applying a start clock control signal, which is a part of the at least one test signal, to the internal clock circuit and sampling an electrical value on a circuit node in the internal clock circuit via a sample clock control signal, which is a part of the at least one test signal, to determine whether the CPU clock signal is being properly transmitted to the CPU.

12. The data processor of claim 1 wherein the test controller enters the low power mode of operation along with the CPU when a first test control state is applied to the test controller via an external test control terminal and the test controller does not enter the low power mode of operation along with the CPU when a second test control state is applied to the test controller via the external test control terminal.

13. An integrated circuit data processor comprising:

a central processing unit (CPU) being coupled to a plurality of external terminals for providing address, data, and control signals from the CPU to an external environment, the CPU having an output for providing a clock enable control signal and an input for receiving an internal CPU clock signal;

an internal clock circuit having a first input for receiving the clock enable control signal, a second input for receiving an external CPU clock signal from an external terminal of the integrated circuit data processor, and an output for providing the internal CPU clock signal to the CPU, the internal clock circuit allowing the external CPU clock signal to be propagated as the internal CPU clock signal in response to a first state communicated by the clock enable control signal and the internal clock circuit isolating the external CPU clock signal from the CPU in response to a second state communicated by the clock enable control signal, the internal clock circuit having a plurality of test inputs and a clock signal test output; and a test controller having a first input for receiving a clock signal selected from a group consisting of: a test clock signal and the external CPU clock signal, a second input for receiving test control information, a plurality of test outputs coupled to the plurality of test inputs of the internal clock circuit, and an input coupled to the clock signal test output, the test control information being used to determine whether the test controller is in a low power mode or a normal mode of operation when the CPU is in a low power mode of operation, the test controller using the plurality of test outputs and the input coupled to the clock signal test output in order to test the internal clock circuit for proper low power clock operation.

14. The integrated circuit data processor of claim 13 wherein the plurality of test outputs of the test controller comprises a start clock signal which is used to test the internal clock circuit to identify data processor components which are responsible for the CPU not being able to exit the low power mode of operation to a normal mode of operation in a proper manner, the normal mode of operation being where the external CPU clock signal is properly communicated to the CPU.

15. The integrated circuit data processor of claim 13 wherein the plurality of test outputs of the test controller comprises a stop clock signal which is used to test the internal clock circuit to identify data processor components which are responsible for the CPU not being able to enter the low power mode of operation in a proper manner, the low power mode of operation being where the external CPU clock signal is properly isolated from the CPU.

16. The integrated circuit data processor of claim 13 wherein the plurality of test outputs of the test controller comprises a sample clock signal which is used to selectively read, over time, a clock test value from a circuit node within the internal clock circuit, the clock test value being used to determine if the external CPU clock signal is properly isolated from the CPU in the low power mode of operation and properly communicated to the CPU in a normal mode of operation.

17. A test controller within a data processing system, the test controller comprising:

a storage device for storing a plurality of binary values provided from external to the test controller;

logic gates, coupled to the storage device, for providing a sample clock control signal in response to a first state stored in the storage device;

logic gates, coupled to the storage device, for providing a stop clock control signal in response to a second state stored in the storage device; and logic gates, coupled to the storage device, for providing a start clock control signal in response to a third state stored in the storage device, wherein the sample clock control signal, the stop clock control signal, and the start clock control signal are used to verify that a clock signal internal to the data processing system is selectively terminated and selectively connected properly when the data processing system is respectively entering and exiting a low power mode of operation.

18. The test controller of claim 17 wherein the test controller is coupled, via the sample clock control signal, the stop clock control signal, and the start clock control signal to a clock circuit internal to the data processing system, the clock circuit having an clock input for receiving the clock signal and a clock output for selectively providing the clock signal, the clock circuit having an isolation transistor in series between the clock input and the clock output and a pull-up transistor coupled to the clock output.

19. The test controller of claim 18 wherein the isolation transistor isolates the clock input from the clock output when the data processing system is in the low power mode of operation and the pull-up transistor applies a stable logic value to the clock output when the data processing system is in the low power mode of operation.

20. The test controller of claim 18 wherein the start clock control signal is used to alter a state of either the isolation transistor or the pull-up transistor in order to force the clock input to be coupled to the clock output by turning the isolation transistor on and turning the pull-up transistor off.

21. The test controller of claim 18 wherein the stop clock control signal is used to alter a state of either the isolation transistor or the pull-up transistor in order to force the clock input to be isolated from the clock output by turning the isolation transistor off and turning the pull-up transistor on.

22. The test controller of claim 18 wherein the sample clock control signal is used to provide a logic value from the clock output to test a logic signal provided via the clock output.

23. The test controller of claim 17 wherein the sample clock control signal is used to provide test values from a clock node internal to the data processing system, the test values allowing the test controller to determine when the data processing system is entering and exiting a low power mode in an improper manner or identifying which circuitry within the data processing system is responsible for improper handling of the clock node when in the low power mode.

24. The test controller of claim 17 wherein the start clock control signal is used to identify malfunctioning circuitry internal to the data processing system, the malfunctioning circuitry preventing the external CPU clock signal from being properly communicated when in a normal mode of operation.

25. The test controller of claim 17 wherein the stop clock control signal is used to identify malfunctioning circuitry internal to the data processing system, the malfunctioning circuitry preventing the external CPU clock signal from being properly isolated when in a low power mode of operation.

26. The test controller of claim 17 wherein a control signal is coupled to the test controller, the control signal allowing the test controller to be in a normal mode of operation when a rest of the data processing system is in the low power mode of operation.

27. An internal clock circuit within a data processor, the internal clock circuit comprising:
- a first input coupled to an external CPU clock conductor;
- a first output coupled to an internal CPU clock conductor;
- an isolation transistor coupled between the external CPU clock conductor and the internal CPU clock conductor;
- a pull-up transistor coupled between the internal CPU clock conductor and a power supply voltage;
- a test transistor coupled between the internal CPU clock conductor and a test conductor, the test conductor providing a second output of the internal clock circuit;
- a second input for receiving a clock enable signal, the clock enable signal coupling the external CPU clock conductor to the internal CPU clock conductor when in a first logic state wherein the coupling is performed by turning-on the isolation transistor and turning-off the pull-up transistor, and the clock enable signal isolating the external CPU clock conductor from the internal CPU clock conductor when in a second logic state, the isolating being performed by turning-off the isolation transistor and turning-on the pull-up transistor;
- a third input for receiving a stop clock signal which, when in a first logic state, overrides the clock enable signal to disconnect the internal CPU clock conductor from the external CPU clock conductor, the disconnecting being performed by turning-off the isolation transistor and turning-on the pull-up transistor;
- a fourth input for receiving a start clock signal which, when in a first logic state, overrides the clock enable signal to couple the internal CPU clock conductor to the external CPU clock conductor, the coupling being performed by turning-on the isolation transistor and turning-off the pull-up transistor; and
- a fifth input for receiving a sample clock signal used to sample a signal on the internal CPU clock conductor by enabling the test transistor.

28. The internal clock circuit of claim 27 wherein the test conductor is coupled to a test controller located internal to the data processor, the test controller being in a normal mode of operation while a rest of the data processor is in a low power mode of operation, the test controller monitoring, over time, signals conducted via the internal CPU clock conductor when the data processor is entering, maintaining, or exiting the low power mode of operation to ensure proper clock operation within the data processor.

29. The internal clock circuit of claim 27 wherein a storage element is coupled to a gate of the pull-up transistor and a gate of the isolation transistor.

30. The internal clock circuit of claim 29 wherein the storage element is a one-bit flip-flop.

31. An internal clock circuit within a data processor, the internal clock circuit comprising:
- a first input coupled to an external CPU clock conductor;
- a first output coupled to an internal CPU clock conductor;
- an isolation transistor coupled between the external CPU clock conductor and the internal CPU clock conductor;
- a pull-up transistor coupled between the internal CPU clock conductor and a power supply voltage;
- a second input for receiving a stop clock signal which, when in a first logic state, disconnects the internal CPU clock conductor from the external CPU clock conductor where the disconnecting is performed by turning-off the isolation transistor and turning-on the pull-up transistor;
- a third input for receiving a start clock signal which, when in a first logic state, couples the internal CPU clock conductor to the external CPU clock conductor where the coupling is performed by turning-on the isolation transistor and turning-off the pull-up transistor; and
- wherein the second input and third input are used to test an operation of the internal clock circuit.

32. The internal clock circuit of claim 31 further comprising:
- a test transistor coupled between the internal CPU clock conductor and a test conductor, the test conductor being a second output used to read over time, for test purposes, a value conducted by the internal CPU clock conductor.

33. The internal clock circuit of claim 32 further comprising:
- a fifth input for receiving a sample clock signal used to sample the value on the internal CPU clock conductor by enabling the test transistor.

34. The internal clock circuit of claim 31 further comprising:
- a fourth input for receiving a clock enable signal generated by a CPU coupled to the internal clock circuit, the clock enable signal coupling the external CPU clock conductor to the internal CPU clock conductor when in a normal mode logic state, the coupling being performed by turning-on the isolation transistor and turning-off the pull-up transistor.

35. The internal clock circuit of claim 31 further comprising:

a fourth input for receiving a clock enable signal generated by a CPU coupled to the internal clock circuit, the clock enable signal isolating the external CPU clock conductor from the internal CPU clock conductor when in a low power mode logic state, the isolating being performed by turning-off the isolation transistor and turning-on the pull-up transistor.

36. The internal clock circuit of claim 31 wherein the internal clock circuit is coupled to both a test controller and a CPU, the test controller having a control input that allows the test controller to be selectively placed in a low power mode of operation or in a normal mode of operation independent of a CPU mode of operation.

37. A method for testing internal clock handling of a data processor when in a low power mode of operation, the method comprising the steps of:

(a) placing the data processor into a low power mode of operation;

(b) setting a condition which allows a test controller within the data processor to operate normally while a remainder of the data processor remains in the low power mode of operation;

(c) sampling, over time, a clock node internal to the data processor to provide a first sampled value;

(d) testing the first sampled value and determining that the internal clock handing is proper when the first sampled value is a stable logic value over time;

(e) when step (d) determines that the first sampled value is fluctuating in logic value over time, apply a stop clock control signal to affect the clock node;

(f) sampling, over time, the clock node to provide a second sampled value; and (g) testing the second sampled value and determining that a problem exits with CPU logic of the data processor when the first sampled value is a stable supply value or determining that an isolation transistor coupled to the clock node is not functioning properly when the second sampled value is fluctuating in logic value over time.

38. The method of claim 37 further comprising the steps of:

(h) providing a low power mode signal to the data processor;

(i) providing a normal mode signal to the data processor;

(j) determining whether the data processor properly responded to the normal mode signal;

(k) when the data processor did not properly respond to the normal mode signal and enter a normal mode of operation, monitoring an internal clock node of the data processor for a clock signal;

(l) when the clock signal is not detected, providing a forced normal mode signal to the data processor;

(m) determining whether the data processor properly responded to the forced normal mode signal; and (n) when the data processor did not properly respond to the forced normal mode signal, identifying that a portion of the data processor is defective.

39. A method for testing internal clock handling of a data processor when in a low power mode of operation, the method comprising the steps of:

(a) placing the data processor into a low power mode of operation while a test controller within the data processor is in a normal mode of operation;

(b) applying a wake-up procedure to the data processor to attempt to bring the data processor out of the low power mode of operation;

(c) testing, via the test controller, to determine if the data processor exited the low power mode of operation and determining that the data processor is functioning properly when the low power mode of operation was exited;

(d) when the data processor has not exited the low power mode of operation in step (c), sampling, over time, a clock node internal to the data processor to provide a first sampled value;

(e) testing, via the test controller, the first sampled value and determining that the data processor is malfunctioning when an oscillating clock signal is detected at the clock node;

(f) when an oscillating clock signal is not detected at the clock node in step (e), apply a start clock control signal to affect the clock node;

(g) sampling, over time, the clock node to provide a second sampled value; and (h) testing the second sampled value and determining that a problem exits within clock logic of the data processor when the first sampled value is an oscillating clock value and determining that an isolation transistor coupled to the clock node and a pull-up transistor coupled to the clock node are both malfunctioning when the second sampled value is fixed in logic value.

40. A method for testing a data processor when in a low power mode of operation, the method comprising the steps of:

(a) providing a low power mode signal to the data processor;

(b) providing a normal mode signal to the data processor;

(c) determining whether the data processor properly responded to the normal mode signal;

(d) when the data processor did not properly respond to the normal mode signal, monitoring an internal clock node of the data processor for a clock signal;

(e) when the clock signal is not detected, providing a forced normal mode signal to the data processor;

(f) determining whether the data processor properly responded to the forced normal mode signal; and (g) when the data processor did not properly respond to the forced normal mode signal, identifying that a portion of a clock enable circuit is defective.

41. The method of claim 40 further comprising the step of:

when the data processor properly responds to the forced normal mode signal, identifying that a second portion of the clock enable circuit is defective.

42. The method of claim 40 further comprises the step of:

when the clock signal is detected in response to the normal mode signal in step (e), identifying that a central processing unit (CPU) is defective.

43. A method for testing an integrated circuit to ensure that the integrated circuit will properly terminate and restart an internal clock signal when respectively entering and exiting low power mode, the method comprising the steps of:

placing the integrated circuit into a low power mode of operation where an internal clock signal to the integrated circuit is should be disabled;

providing a condition to the integrated circuit wherein internal test logic of the integrated circuit remains functional while all other portions of the integrated circuit remain in the low power mode of operation;

using a stop clock control signal, which is generated by the internal test logic, to ensure that the internal clock signal is properly disabled when the integrated circuit is in the low power mode of operation;

applying a wake-up condition to the integrated circuit to get the integrated circuit to exit the low-power mode of operation; and using a start clock control signal, which is generated by the internal test logic, to ensure that the internal clock signal is properly enabled in response to the wake-up condition.

44. The method of claim 43 further comprising a step of:

using a sample clock signal, which is generated by the internal test logic, to read a clock node internal to the integrated circuit to ensure that the internal clock signal is properly disabled when the integrated circuit is in the low power mode of operation.

45. The method of claim 43 further comprising a step of:

using a sample clock signal, which is generated by the internal test logic, to read a clock node internal to the integrated circuit to ensure that the internal clock signal is properly enabled in response to the wake-up condition.

* * * * *

UNITED STATES PATENT AND TRADEMARK OFFICE
CERTIFICATE OF CORRECTION

PATENT NO. : 5,553,236
DATED : September 3, 1996
INVENTOR(S) : Juan G. Revilla; Alfred L. Crouch It is certified that error appears in the above-indentified patent and that said Letters Patent is hereby corrected as shown below:

Column 14, line 26: Change "exits" to --exists--

Signed and Sealed this

Twenty-third Day of September, 1997

Attest:

BRUCE LEHMAN

Attesting Officer    Commissioner of Patents and Trademarks